United States Patent
Kim et al.

(10) Patent No.: US 8,900,942 B2
(45) Date of Patent: Dec. 2, 2014

(54) SEMICONDUCTOR DEVICES AND METHODS OF FABRICATING THE SAME

(75) Inventors: Dong Hyuk Kim, Seongnam-si (KR); Dongsuk Shin, Yongin-si (KR); Myungsun Kim, Hwaseong-si (KR); Hoi Sung Chung, Hwaseong-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 264 days.

(21) Appl. No.: 13/422,077

(22) Filed: Mar. 16, 2012

(65) Prior Publication Data
US 2012/0241815 A1 Sep. 27, 2012

(30) Foreign Application Priority Data

Mar. 23, 2011 (KR) ........................ 10-2011-0026052

(51) Int. Cl.
| | | |
|---|---|---|
| H01L 21/20 | (2006.01) | |
| H01L 21/335 | (2006.01) | |
| H01L 21/8234 | (2006.01) | |
| H01L 21/02 | (2006.01) | |
| H01L 29/66 | (2006.01) | |
| H01L 29/78 | (2006.01) | |
| H01L 21/306 | (2006.01) | |
| H01L 21/3065 | (2006.01) | |

(52) U.S. Cl.
CPC .... *H01L 21/823425* (2013.01); *H01L 21/0243* (2013.01); *H01L 21/02532* (2013.01); *H01L 21/0262* (2013.01); *H01L 21/02639* (2013.01); *H01L 21/823412* (2013.01); *H01L 21/02057* (2013.01); *H01L 29/66636* (2013.01); *H01L 29/7848* (2013.01); *H01L 21/30608* (2013.01); *H01L 21/3065* (2013.01)
USPC .......................... 438/198; 438/300; 438/478

(58) Field of Classification Search
USPC .......... 257/190, 327, 346, E21.103, E29.255; 438/230, 288, 622, 627, 198, 300, 478
See application file for complete search history.

(56) References Cited

U.S. PATENT DOCUMENTS

| | | | |
|---|---|---|---|
| 5,089,441 A | 2/1992 | Moslehi | |
| 5,725,677 A | 3/1998 | Sugino et al. | |
| 6,235,568 B1 | 5/2001 | Murthy et al. | |
| 7,358,551 B2 * | 4/2008 | Chidambarrao et al. | ..... 257/288 |
| 7,651,948 B2 | 1/2010 | Kim et al. | |
| 7,732,285 B2 * | 6/2010 | Sell et al. | ....... 438/288 |
| 7,994,066 B1 * | 8/2011 | Capellini et al. | ............... 438/734 |
| 2007/0004123 A1 * | 1/2007 | Bohr et al. | ..................... 438/230 |
| 2009/0101942 A1 * | 4/2009 | Dyer | ............................ 257/288 |

FOREIGN PATENT DOCUMENTS

| | | |
|---|---|---|
| JP | 06-151394 | 5/1994 |
| JP | 2006-059858 | 3/2006 |
| JP | 2009-543357 | 12/2009 |
| KR | 10-2009-0026354 | 3/2009 |

OTHER PUBLICATIONS

Tsutomu Sato et al, "Micro-structure Transformation of Silicon: A Newly Developed Transformation Technology for Patterning Silicon Surfaces using the Surface Migration of Silicon Atoms by Hydrogen Annealing", Jpn. J. Appl. Phys. vol. 39 (2000) pp. 5033-5038.

* cited by examiner

*Primary Examiner* — Daniel Shook
(74) *Attorney, Agent, or Firm* — Ellsworth IP Group PLLC

(57) ABSTRACT

A method of fabricating one or more semiconductor devices includes forming a trench in a semiconductor substrate, performing a cycling process to remove contaminants from the trench, and forming an epitaxial layer on the trench. The cycling process includes sequentially supplying a first reaction gas containing germane, hydrogen chloride and hydrogen and a second reaction gas containing hydrogen chloride and hydrogen onto the semiconductor substrate.

20 Claims, 14 Drawing Sheets

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119(a) from Korean Patent Application No. 10-2011-0026052, filed on Mar. 23, 2011, in the Korean Intellectual Property Office, the entire contents of which are hereby incorporated by reference.

BACKGROUND

1. Field of the General Inventive Concept

The general inventive concept relates to a semiconductor device. More particularly, the general inventive concept relates to a method of fabricating a semiconductor device having an improved performance.

2. Description of the Related Art

There has been intensive research to increase an integration density of a semiconductor device and improve performance thereof, such as an operating speed and an operating electric current. For instance, in order to improve the performance of the semiconductor device, there have been suggested methods of inducing strain or stress to a transistor.

SUMMARY

The present general inventive concept provides fabrication methods capable of effectively applying strain or stress to a transistor channel of a semiconductor device, thereby increasing carrier mobility.

Additional features and utilities of the present general inventive concept will be set forth in part in the description which follows and, in part, will be obvious from the description, or may be learned by practice of the general inventive concept.

Other exemplary embodiments of the present general inventive concept provide methods of fabricating a semiconductor device with a high quality epitaxial layer.

Still other exemplary embodiments of the present general inventive concept provide semiconductor device fabrication methods capable of sharply maintaining a profile of a trench and effectively removing a native oxide layer and/or a contaminant.

According to some features of the present general inventive concept, a native oxide layer can be removed from a trench surface using a reaction gas containing germanium, and an extra germanium layer, which may be unintentionally deposited on the trench surface, can be removed using a second reaction gas capable of etching germanium. According to other features of the present general inventive concept, the trench can be maintained to have a sharp tip. According to still other features of the present general inventive concept, it is possible to maintain the tip of the trench sharply. Further, it may be possible to suppress and/or prevent the trench from being deformed. According to even other features of the present general inventive concept, it is possible to effectively remove elements or factors providing a negative effect on a growth rate of an epitaxial layer in at least one exemplary embodiment, a seed layer to grow an epitaxial layer can be prepared to have a clean surface, before growing the epitaxial layer.

According to exemplary embodiments of the present general inventive concept, a method of fabricating a semiconductor device may include forming a trench in a semiconductor substrate, performing a cycling process to remove contaminants from the trench, the cycling process including sequentially supplying a first reaction gas and a second reaction gas onto the semiconductor substrate, the first reaction gas containing germane ($GeH_4$), hydrogen chloride (HCl) and hydrogen ($H_2$) and the second reaction gas containing hydrogen chloride (HCl) and hydrogen ($H_2$), and forming an epitaxial layer on the trench.

In at least one exemplary embodiment, the performing of the cycling process may include removing a native oxide layer from the trench using the germane ($GeH_4$) of the first reaction gas and removing a germanium layer from the trench using the hydrogen chloride (HCl) of the first reaction gas.

In at least one exemplary embodiment, the performing of the cycling process may further include removing a remaining portion of the germanium layer, which may not be removed by the first reaction gas, using the hydrogen chloride (HCl) of the second reaction gas.

In at least one exemplary embodiment, the supplying of the first reaction gas may include supplying the first reaction gas under a pressure of about 1 Torr to about 100 Torr at a temperature of about 500° C. to about 800° C.

In at least one exemplary embodiment, the supplying of the first reaction gas may include supplying the hydrogen chloride (HCl) with a flow rate greater than 150 times a flow rate of the germane ($GeH_4$).

In at least one exemplary embodiment, the supplying of the first reaction gas may include supplying the germane ($GeH_4$) with a partial pressure of 0.3 mTorr or less and with a flow rate of about 0.75 sccm or more.

In at least one exemplary embodiment, the supplying of the first reaction gas may include supplying the hydrogen chloride (HCl) with a partial pressure greater than 150 times a partial pressure of the germane ($GeH_4$) and with a flow rate of about 150 sccm or more.

In at least one exemplary embodiment, at least one of the supplying of the first reaction gas and the supplying of the second reaction gas may include the hydrogen ($H_2$) with a flow rate of about 30 slm to about 50 slm.

In at least one exemplary embodiment, the supplying of the second reaction gas may include supplying the second reaction gas under a pressure of about 1 Torr to about 100 Torr at a temperature of about 500° C. to about 800° C. or about 700° C. to about 800° C. during a process time, of which a temporal length ratio relative to the first reaction gas may be about 0.1 to about 10.

In at least one exemplary embodiment, the performing of the cycling process may include sequentially supplying the first reaction gas and the second reaction gas, under a pressure of about 1 Torr to about 100 Torr at a temperature of about 500° C. to about 800° C.

In at least one exemplary embodiment, the forming of the epitaxial layer may include growing a layer with a different lattice constant from the semiconductor substrate from a surface of the trench.

According to other exemplary embodiments of the present general inventive concept, a method of fabricating a semiconductor device may include forming a plurality of gate electrode structures on a semiconductor substrate, etching the semiconductor substrate between the gate electrode structures to form a trench including inner surfaces defining at least one tip, some of the inner surfaces having a relatively high density compared with the others of the inner surfaces, and the tip protruding toward a channel region, which may be a portion of the semiconductor substrate below the gate electrode structure, supplying a first reaction gas containing germane ($GeH_4$), hydrogen chloride (HCl) and hydrogen ($H_2$)

onto the semiconductor substrate to remove a native oxide layer and a germanium layer from the inner surfaces of the trench, supplying a second reaction gas containing hydrogen chloride (HCl) and hydrogen (H2) onto the semiconductor substrate to remove a remaining portion of the germanium layer, which may not be removed by the first reaction gas, and forming a junction region in the trench.

In at least one exemplary embodiment, the semiconductor substrate may be a silicon substrate having a top surface of (100) crystal plane, and the forming of the trench may include forming inner surfaces having a (111) crystal plane, which serve as the inner surfaces having a relatively high density. The tip may be provided as a corner defined by the inner surfaces of the (111) crystal plane.

In at least one exemplary embodiment, the forming of the trench may include isotropically etching the semiconductor substrate using a dry etching process to form a preliminary trench having a substantially elliptical profile in the semiconductor substrate, and etching the semiconductor substrate using a wet etching process to enlarge the preliminary trench. The trench may be formed to have a sigma (Z) shaped profile defined by the inner surfaces of the (111) crystal plane.

In at least one exemplary embodiment, the forming of the junction region may include epitaxially growing a layer with a different lattice constant from the semiconductor substrate.

In at least one exemplary embodiment, the forming of the junction region may include epitaxially growing a silicon-germanium (SiGe) layer with a lattice constant greater than the semiconductor substrate of silicon, and the gate electrode structure and the junction region constitute a PMOS transistor.

In at least one exemplary embodiment, the forming of the junction region may include epitaxially growing a silicon-carbide (SiC) layer with a lattice constant smaller than the semiconductor substrate of silicon, and the gate electrode structure and the junction region constitute an NMOS transistor.

In at least one exemplary embodiment, the supplying of the first reaction gas may be followed by the supplying of the second reaction gas, and the method may include performing the sequential supplying of the first and second reaction gases onto the semiconductor substrate one or more times.

In at least one exemplary embodiment, at least one of the supplying of the first reaction gas and the supplying of the second reaction gas may be performed under a pressure of about 1 Torr to about 100 Torr at a temperature of about 500° C. to about 800° C. Here, the supplying of the first reaction gas may include supplying the hydrogen chloride (HCl) with a flow rate greater than 150 times a flow rate of the germane (GeH4).

In at least one exemplary embodiment, the supplying of the first reaction gas may be performed during a process time of about 1 sec to about 120 sec, and the supplying of the second reaction gas may be performed during a process time, of which a ratio relative to that of the first reaction gas may be about 0.1 to about 10.

In another feature of the present general inventive concept, a method of increasing stress on a channel of a gate structure including in a semiconductor device comprises forming a first trench in the channel, etching the first trench to form a second trench having corners being substantially pointed, the corners including a tip portion extending laterally with respect to the channel and beneath the gate structure, and forming a junction region having a lattice constant different from a material of the channel to exert a stress on the channel.

In yet another feature of the present general inventive concept, a semiconductor device comprises a trench having corners extending laterally with respect to the channel and beneath the gate structure, the corners including a tip portion having a curvature of at most 5 nm, and a junction region having a lattice constant different from a material of the channel to maintain the curvature of the tip portion and exert a stress on the channel.

BRIEF DESCRIPTION OF THE DRAWINGS

These and/or other features and utilities of the present general inventive concept will become apparent and more readily appreciated from the following description of the exemplary embodiments, taken in conjunction with the accompanying drawings of which.

Figure 1A:
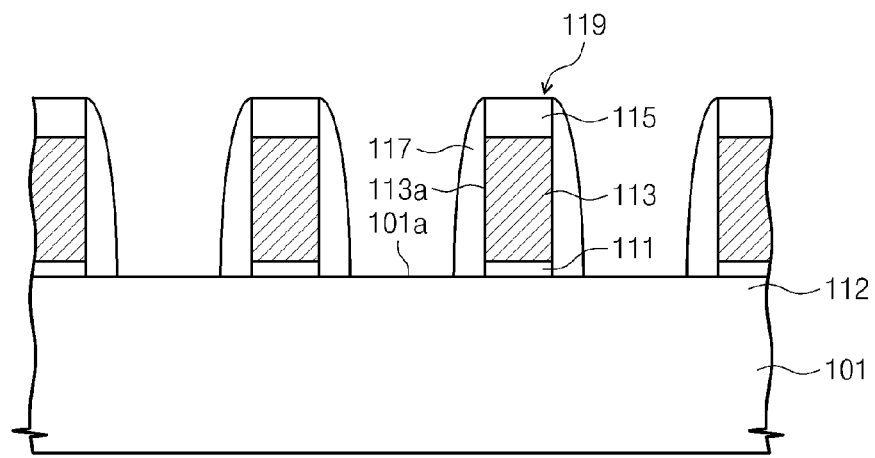
FIGS. 1A through 1I are sectional views illustrating methods of fabricating a semiconductor device according to exemplary embodiments of the present general inventive concept.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EXEMPLARY EMBODIMENTS

Reference will now be made in detail to the exemplary embodiments of the present general inventive concept, examples of which are illustrated in the accompanying drawings, wherein like reference numerals refer to the like elements throughout. The exemplary embodiments are described below in order to explain the present general inventive concept while referring to the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein describes particular exemplary embodiments and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments of the present general inventive concept are described herein with reference to cross-sectional illustrations that are schematic illustrations of idealized exemplary embodiments (and intermediate structures) of exemplary embodiments. As such, variations from the shapes of the illustrations as a result, for example, of manufacturing techniques and/or tolerances, are to be expected. Thus, exemplary embodiments of the present general inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments of the present general inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
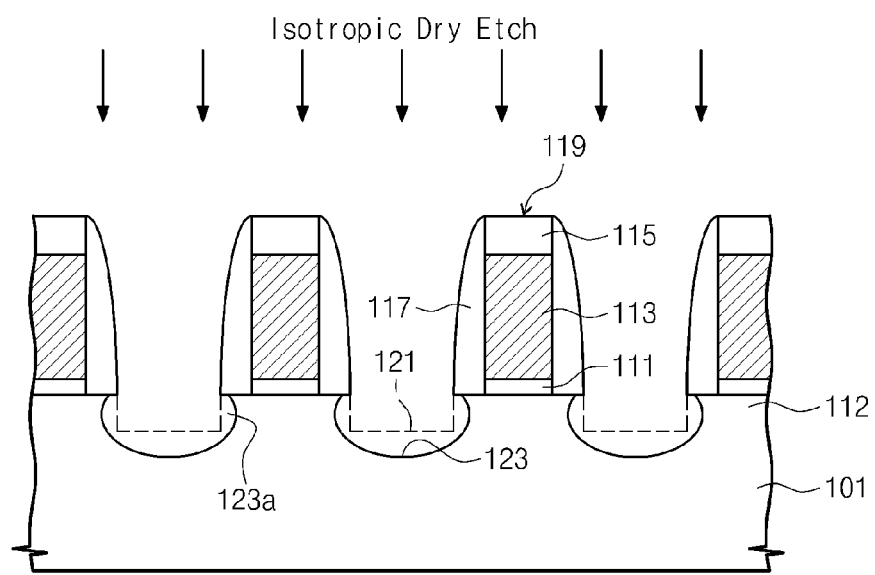
Figure 1C:
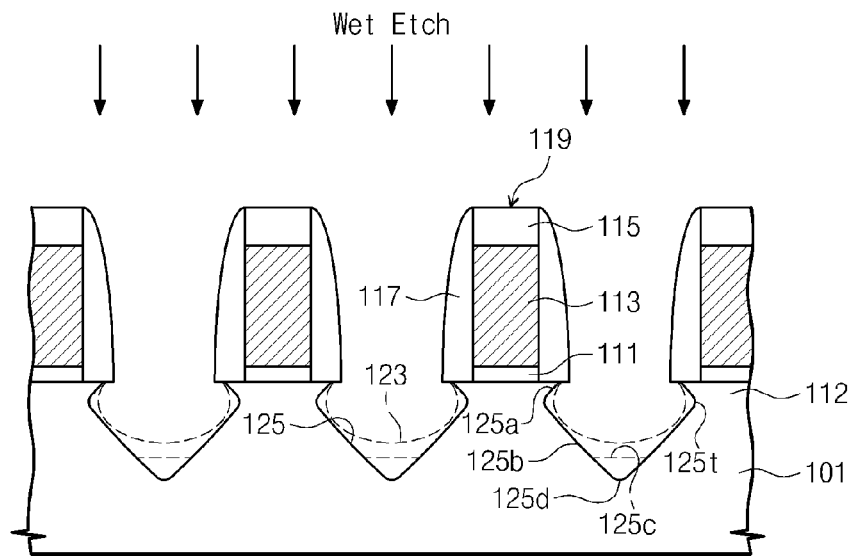
Figure 1D:
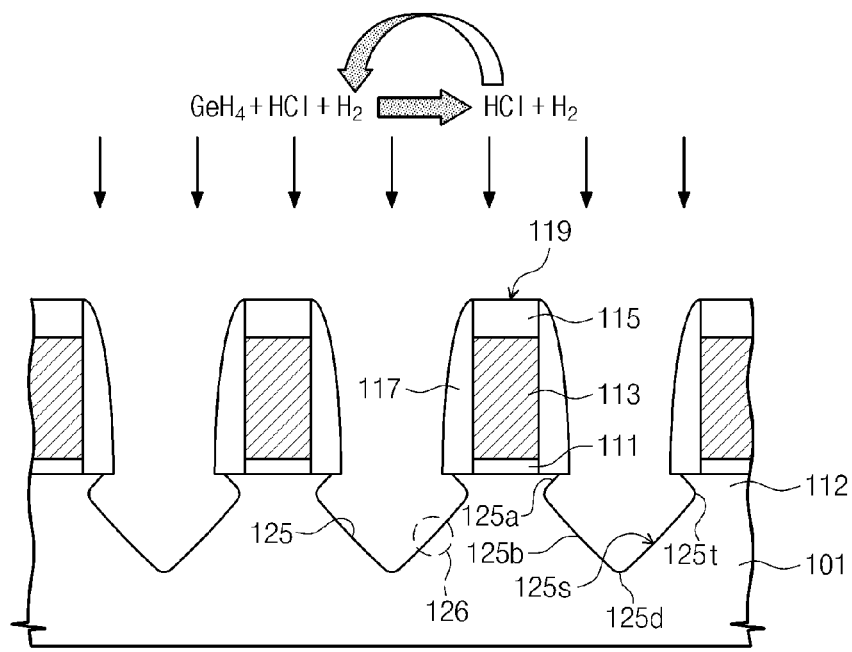
Figure 1E:
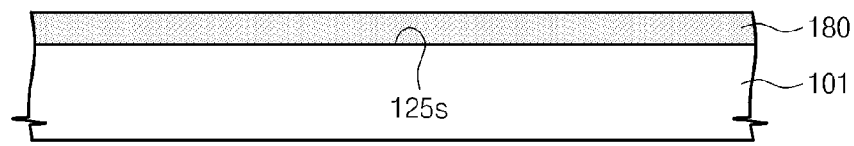
Figure 1F:
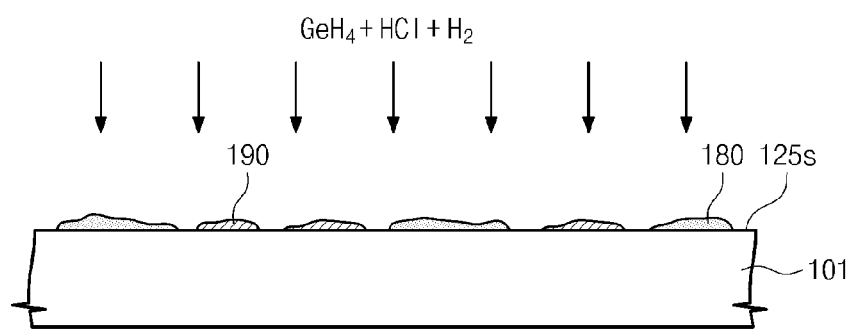
Figure 1G:
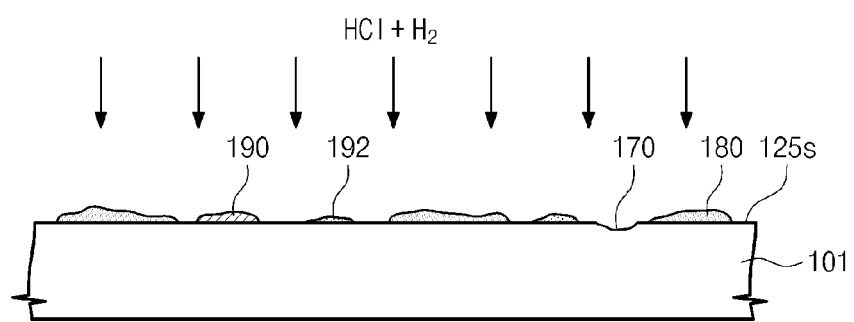

FIGS. 1A through 1I are sectional views illustrating methods of fabricating a semiconductor device according to exemplary embodiments of the present general inventive concept, and FIGS. 1E through 1G are enlarged sectional views of a portion of the semiconductor device shown in FIG. 1D.

Referring to FIG. 1A, a semiconductor substrate 101 may be provided. The semiconductor substrate 101 may be a material with a semiconductor property (e.g., silicon). For instance, the semiconductor substrate 101 may include a silicon wafer with a (100) crystal plane. At least one gate electrode structure 119 may be formed on a surface 101a of the semiconductor substrate 101 (operation 610 of FIG. 6). The surface 101a may have the (100) crystal plane. A gate insulating layer 111 may be formed on the semiconductor substrate 101, and a plurality of gates 113 may be formed on the gate insulating layer 111. In some exemplary embodiments, gate spacers 117 may be formed on sidewalls 113a of the gates 113. In some exemplary embodiments, the gate insulating layer 111 may include at least one of an oxide layer (e.g., SiO2), a nitride layer (e.g., SiN, Si3N4, and SiON), or a high-k dielectric (e.g., HfO2, and ZrO2). The gate 113 may include at least one of a doped polysilicon layer, an undoped polysilicon layer, a metal layer, or any combination thereof. For instance, the gate 113 of an NMOS transistor may include a polysilicon layer doped with arsenic (As) and/or phosphorus (P), and the gate 113 of a PMOS transistor may include a polysilicon layer doped with boron (B). The gate spacer 117 may be formed of an oxide layer, a nitride layer, or any combination thereof. On the gate 113, there may further be a hard mask layer 115, which may be formed of an oxide layer, a nitride layer, or any combination thereof. A portion of the semiconductor substrate 101, which is located below the gate electrode structure 119, may serve as a channel 112, i.e., a pathway, to transport one or more carriers.

Figure 6:
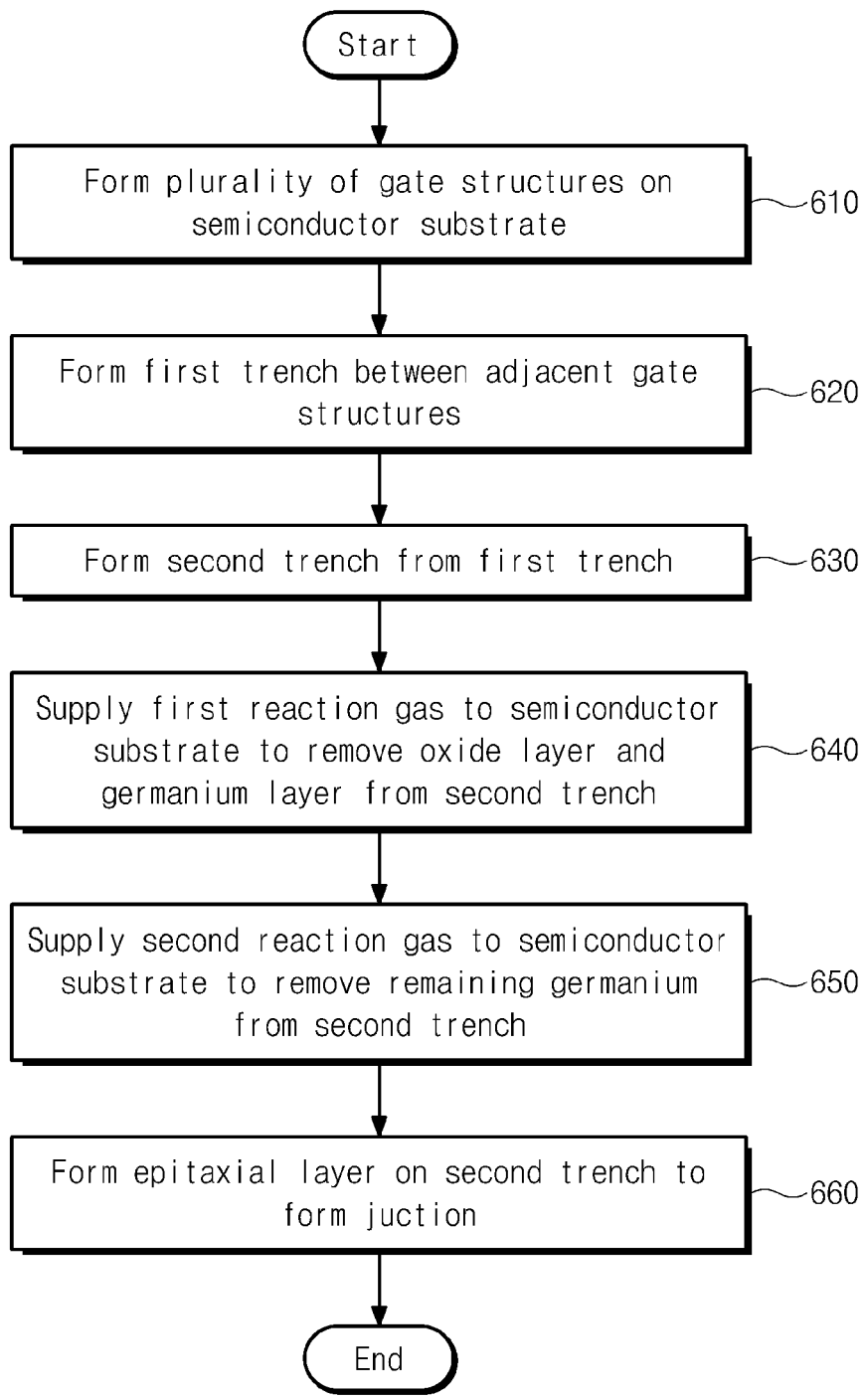
FIG. 6 is a flowchart illustrating an exemplary method of fabricating a semiconductor device.

Referring to FIG. 1B, first trenches 123 may be formed by etching portions of the semiconductor substrate 101, which are exposed between the gate electrode structures 119 (operation 620 of FIG. 6). In some exemplary embodiments, an isotropic dry etching technique may be used to form the trenches 123 in the semiconductor substrate 101. The isotropic dry etching technique may be performed using an etchant having high reactivity toward silicon of the semiconductor substrate 101, for instance, a mixture gas plasma of hydrogen bromide (HBr) and chlorine (Cl2), a mixture gas plasma of sulphur hexafluoride (SF6) and chlorine (Cl2), or a mixture gas plasma of hydrogen bromide (HBr), chlorine (Cl2), and sulphur hexafluoride (SF6). In some exemplary embodiments, portions of the semiconductor substrate 101 exposed between the gate spacers 117 may be vertically etched at an initial stage of the isotropic dry etching process, but portions of the semiconductor substrate 101 located below the gate spacers 117 may be laterally and vertically etched as the isotropic dry etching process progresses. As a result, portions of the semiconductor substrate 101 may be undercut below the gate electrode structure 119. Accordingly, the first trench 123 may include an undercut cavity 123a that extends laterally beneath the gate electrode structure 119. In at least one exemplary embodiment the undercut cavity 123a may be formed beneath the gate spacer 117 of the gate electrode structure 119. The first trench 123 may be formed of various shapes including, but not limited to, an elliptical shape. In other exemplary embodiments, the formation of the first trench 123 may include forming recess regions 121 using an anisotropic dry etching process and then laterally enlarging the recess regions 121 using the isotropic dry etching process. The anisotropic dry etching process may be performed using a mixture gas plasma of fluorine (F), carbon (C), oxygen (O) and argon (Ar), for instance, CF4/O2/Ar plasma or CHF3/O2/Ar plasma.

Referring to FIG. 10, second trenches 125 may be formed in the semiconductor substrate 101(operation 630 of FIG. 6). The formation of the second trench 125 may include, for instance, further manipulating the first trench 123 using a wet etching process. For example, the first trenches 123 may be enlarged to form the second trenches 123.

In at least one exemplary embodiment, a wet etching process may be performed using at least one etchant including, but not limited to, ammonium hydroxide (NH4OH), tetramethylammonium hydroxide (TMAH; (CH3)4NOH), potassium hydroxide (KOH), sodium hydroxide (NaOH), BTMH (benzoic acid [(thiophen-2-yl)methylene]hydrazide), amine etchant, or any combination thereof. In at least one exemplary embodiment, the semiconductor substrate 101 includes a single-crystal silicon. In this case, a (111) crystal plane has a relatively high density compared with other crystal planes, and therefore, an etching amount of the (111) crystal plane may be saturated during the wet etch process. As a result, after the wet etch process, a surface 125s of the second trench 125 may mainly consist of inner surfaces with (111) crystal plane, e.g., a first plane 125a and a second plane 125b. In other words, the second trench 125 may be formed to have a sigma (Z) profile. The first plane 125a and the second plane 125b may come in contact with each other in such a way that they form a corner including a sharp tip 125t sharply protruding toward the channel 112, and extending laterally beneath the gate electrical structure. In at least one exemplary embodiment, the tip 125t of the second trench 125 extends laterally beneath the spacer 117 and is aligned with the side wall 113a of the respective gate 113. The tips 125t having the sharp shape increase the stress applied to the channel 112, as discussed in greater detail below.

In some exemplary embodiments, the second planes 125b may come in contact with each other in such a way that they form a tip 125d at the bottom of the second trench 125. In other exemplary embodiments, a third plane 125c with (100) crystal plane may form the bottom surface of the second trench 125. Alternatively, by adjusting a process time in the wet etching process, the second trench 125 may be formed not to have the third crystal plane 125c.

Referring to FIG. 1D, a cleaning process may be performed to remove a contaminant, such as a native oxide layer, which may be formed on the surface 125s of the second trench 125. In some exemplary embodiments, the surface 125s of the second trench 125 may be used as a seed layer to grow a subsequent epitaxial layer (identified by a reference numeral 150 of FIG. 2H). Since the contaminant e.g., the native oxide layer, may be removed from the surface 125s of the second trench 125 during the cleaning process, it may be possible to form a high quality epitaxial layer. In some exemplary embodiments, the cleaning process may include a first operation configured to remove the native oxide layer using a first reaction gas (operation 640 of FIG. 6) and a second operation configured to remove other contaminants or an unintended layer using a second reaction gas (operation 650 of FIG. 6), which may be sequentially performed. Hereinafter, a process of sequentially performing the first and second operations will be called a cycling process. The cleaning process may include performing the cycling process at least one time. The cycling process will be described in more detail with reference to FIGS. 1E through 1G, in which a portion 126 of the surface 125s of the second trench 125 is enlarged.

Referring to FIGS. 1D and 1E, the native oxide layer 180 may be formed on the surface 125s of the second trench 125. In the case that the semiconductor substrate 101 is formed of silicon (Si), the native oxide layer 180 may be a silicon oxide layer (SiOx).

Referring to FIG. 1F, the first reaction gas may be supplied onto the semiconductor substrate 101 to remove the native oxide layer 180 (operation 640 of FIG. 6). The first reaction gas may be a gas containing germanium. In some exemplary embodiments, the first reaction gas may include germane or germanium tetrahydride (GeH4). The germane (GeH4) may be decomposed into germanium (Ge) and hydrogen (H2), as follows:

$$GeH4 \rightarrow Ge + 2H2. \quad \text{(Reaction Formula 1)}$$

Then, the germanium (Ge) decomposed from germane (GeH4) may be reacted with silicon oxide (SiOx) of the native oxide layer 180 to form a volatile germanium oxide (GeO), as follows:

$$x Ge + SiOx \rightarrow x GeO\uparrow + Si. \quad \text{(Reaction Formula 2)}$$

In some exemplary embodiments, the native oxide layer 180 on the surface 125s of the second trench 125 may be removed through various reactions with the germane gas (GeH4) described in the following reaction formulas 3 to 6.

$$GeH4 + (2/x)SiOx \rightarrow H2O\uparrow + H2\uparrow + GeO\uparrow + (2/x)Si \quad \text{(Reaction Formula 3)}$$

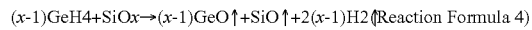
$$(x-1)GeH4 + SiOx \rightarrow (x-1)GeO\uparrow + SiO\uparrow + 2(x-1)H2 \quad \text{(Reaction Formula 4)}$$

$$x GeH4 + SiOx \rightarrow x GeO\uparrow + 2x H2\uparrow + Si \quad \text{(Reaction Formula 5)}$$

$$x GeH4 + SiOx \rightarrow x GeO\uparrow + SiH4 \quad \text{(Reaction Formula 6)}$$

Since, as shown in the reaction formulas 1 to 6, germanium (Ge) decomposed from germane gas (GeH4) may be reacted with silicon oxide (SiOx) to form a volatile germanium oxide (GeO), the native oxide layer 180 may be removed.

In addition to the removal of the native oxide layer 180, the supplying of germane gas (GeH4) may result in a germanium layer 190 deposited on the surface 125s, as described by the following reaction formula 7.

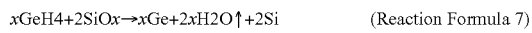
$$x GeH4 + 2SiOx \rightarrow x Ge + 2x H2O\uparrow + 2Si \quad \text{(Reaction Formula 7)}$$

In some exemplary embodiments, the first reaction gas may further hydrogen chloride (HCl) serving as an etchant to remove the germanium layer 190. The hydrogen chloride (HCl) may be reacted with the germanium layer 190 to form gaseous germanium chloride (GeClx), as described by the following reaction formula 8. Therefore, the germanium layer 190 may be removed.

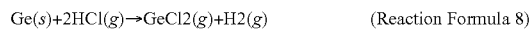
$$Ge(s) + 2HCl(g) \rightarrow GeCl2(g) + H2(g) \quad \text{(Reaction Formula 8)}$$

As described above, the first reaction gas may include the germane (GeH4) supplied as an etchant to remove the native oxide layer 180 and the hydrogen chloride (HCl) supplied as an etchant to remove the germanium layer 190 and/or as a controlling gas to suppress a deposition of the germanium layer 190. The first reaction gas may further include a hydrogen gas (H2), which may be used to control a concentration of germanium (Ge) and/or as a carrier gas of the hydrogen chloride (HCl).

In some exemplary embodiments, the first operation supplying the first reaction gas containing a mixture gas of germane (GeH4), hydrogen chloride (HCl), and hydrogen (H2) onto the semiconductor substrate 101 may be performed under a pressure of about 1 Torr to about 100 Torr at a temperature of about 500° C. to about 800° C. (more particularly, about 500° C. to about 700° C. or about 650° C. to about 700° C.) for about 1 sec to about 120 sec. During the first operation, the hydrogen (H2) may be supplied with a flow rate of about 30 slm to about 50 slm, the hydrogen chloride (HCl) may be supplied with a flow rate of about 150 sccm or more, and the germane (GeH4) may be supplied with a flow rate of about 0.75 sccm or more. A ratio in flow rate of the hydrogen chloride (HCl) to the germane (GeH4) may be 150 or more, for instance, 200. A partial pressure of the germane (GeH4) may be controlled about 0.3 mTorr or less, and a partial pressure of the hydrogen chloride (HCl) may be greater than that of the germane (GeH4). For instance, a ratio in partial pressure of the hydrogen chloride (HCl) to the germane (GeH4) may be about 150 or more.

In at least one exemplary embodiment, the first operation may be performed, for about 60 sec, under a process condition described in the following table 1, where the first reaction gas may be supplied with a total flow rate of 40150.75 sccm and a ratio in flow rate of the hydrogen chloride (HCl) to the germane (GeH4) may be controlled to be about 200.

TABLE 1

| | Flow Rate (sccm) | Atomic Percentage (atomic %) | Partial Pressure (mTorr) | Pressure (Torr) | Temperature (° C.) |
|---|---|---|---|---|---|
| H₂ | 40,000 | 0.99625 | 9962.45 | 10 | 680 |
| HCl | 150 | 0.00374 | 37.36 | | |
| GeH₄ | 0.75 | 1.9E−0.5 | 0.19 | | |

By the first operation, the native oxide layer 180 may be removed from the surface 125s. As will be described with reference to FIGS. 2A through 2E, when the cleaning process is performed in a non-cycling manner (i.e., only with the first operation), some germanium atoms may be un-etched or produced from the decomposition of the germane (GeH4) to detectably remain on the surface 125s of the second trench 125. In addition to the presence of empirically detectable germanium atoms, performing only the first operation may result in a deformation of the second trench 125 with the sigma profile. For example, the tips 125t and 125d thereof may be deformed to have rounded shapes, as opposed to the sharp tips 125t illustrated in FIGS. 1C, 1D, 1H and 1I. The second operation of supplying the second reaction gas may contribute to preserve sharp shapes of the tips 125t and 125d, and may assist in effectively removing the extra germanium layer 190. Accordingly, preserving the sharp shapes of the tips 125t and 125d may provide an improved junction 150 that more effectively provides a stress to the channel 112.

Referring to FIGS. 1D and 1G, after the first operation of removing of the native oxide layer 180, the second reaction gas may be supplied onto the semiconductor substrate 101 to remove the extra germanium layer 190 (operation 650 of FIG. 6). The second reaction gas may include a hydrogen chloride (HCl) gas. In addition, the second reaction gas may further include a hydrogen (H2) gas as a carrier gas of the hydrogen chloride (HCl) gas. In the case that a mixture gas of hydrogen chloride (HCl) and hydrogen (H2) is supplied onto the semiconductor substrate 101, as described with reference to the above reaction formula 8, the extra germanium layer 190 may be etched to form an etched germanium layer 192 and removed from the surface 125s at a final stage of the cleaning process. In addition, the surface 125s of silicon may be reacted with the hydrogen chloride (HCl) gas to form an etched portion 170 as described with reference to the following reaction formula 9. In some exemplary embodiments, the silicon may be etched to form the etched portion 170 on the surface 125s. In some exemplary embodiment, the etched portion 170 may be formed by a reaction between the hydrogen chloride (HCl) gas and a silicon-germanium (SiGe) layer on the surface 125s, which may be formed from a reaction of Ge and Si.

$$Si(s)+2HCl(g)\rightarrow SiCl2(g)+H2(g) \quad \text{(Reaction Formula 9)}$$

In some exemplary embodiments, ways of adjusting the flow rate of the hydrogen chloride (HCl) gas and/or an operation time of the second operation may be used to suppress or prevent the etched portion 170 from occurring. In at least one exemplary embodiment, the second operation may be performed using the substantially same environmental condition as the first operation. For instance, the first and second operations may be sequentially performed using the process condition given by the above table 1, under the same pressure of and temperature conditions, which may be selected in a range of about 1 Torr to about 100 Torr and about 500° C. to about 800° C. (more particularly, about 10 Torr and about 680° C.).

In other exemplary embodiments, the second operation may be performed using an environmental condition, which is similar to the first operation but differs from the first operation in that the temperature may be in a range of about 700° C. to about 800° C. and/or a ratio in operation time of the first operation to the second operation may be set to be in about 0.1 to about 10.

In still other exemplary embodiments, the first operation may be performed at a temperature of about 500° C. to about 700° C. or about 650° C. to about 700° C., while other process conditions thereof may be the same as the aforementioned conditions. The second operation may be performed at a temperature range of about 700° C. to about 800° C. and/or with a ratio in operation time of the first operation to the second operation that is set to be in about 0.1 to about 10.

According to exemplary embodiments of the present general inventive concept, the performing the cycling process at least one time may make it possible to preserve the sharp profile of the second trench 125 and to effectively remove the native oxide layer 180 and the extra germanium layer 190.

In at least one exemplary embodiment, the cleaning process may include the cycling process performed at a temperature of 700° C. or more, and another cycling process or the first operation may be performed at a temperature of 700° C. or less. Even when the cleaning process includes only the first operation performed at a temperature of 700° C. or less, if the ratio in flow rate of hydrogen chloride (HCl) to germane (GeH4) is relatively high (e.g., greater than about 150), the native oxide layer 180 and the extra germanium layer 190 may be effectively removed.

Figure 1H:
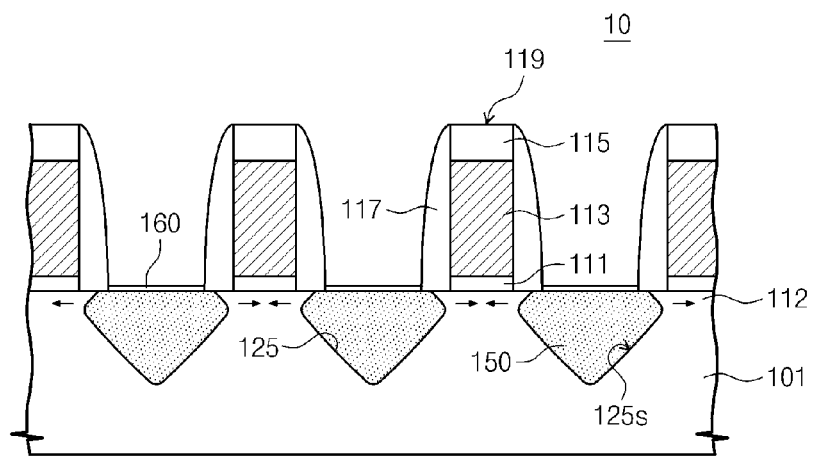
Figure 1I:
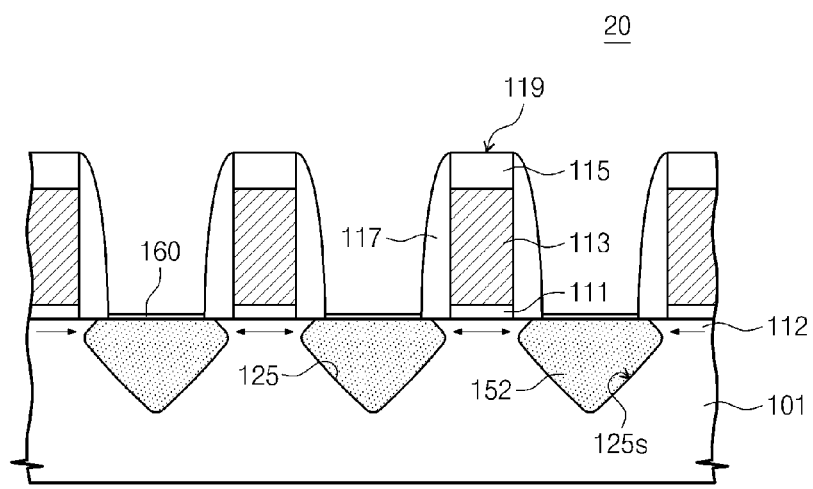

As shown in FIGS. 1H and 1I, a material with a lattice constant different from silicon (Si) may be epitaxially grown from the second trench 125 (operation 660 of FIG. 6). In some exemplary embodiments, a compressive stress caused by the difference in lattice constant may be exerted on the channel 112, as shown in a semiconductor device 10 of FIG. 1H. In other exemplary embodiments, a tensile stress caused by the difference in lattice constant may be exerted on the channel 112, as shown in a semiconductor device 20 of FIG. 1I. At least one of the semiconductor devices 10 and 20 may include at least one memory element and moreover, may be used to realize a memory card, a mobile device, or a computer.

In more detail, referring to FIG. 1H, the second trench 125 may be filled with silicon-germanium (SiGe) to form a junction region 150. The formation of the junction region 150 may include epitaxially growing a silicon-germanium layer from the second trench 125 and then doping the silicon-germanium layer with boron (B) atoms. Alternatively, the junction region 150 may be formed by epitaxially growing a boron-doped silicon-germanium layer. The junction region 150 of silicon-germanium (SiGe) may have a greater lattice constant than the channel 112 of silicon (Si), the junction region 150 may exert a compressive stress (depicted by a solid arrow line) on the channel 112. As a result, PMOS transistors of the semiconductor device 10 may have increased mobility of majority carriers (i.e., holes).

According to exemplary embodiments of the present general inventive concept, the cycling process may make it possible to effectively remove the native oxide layer and the extra germanium layer from the surface 125s of the second trench 125, and thus, a high quality epitaxial layer (i.e., the junction region 150) may be grown fast compared with the absence of the cycling process. In addition, since it is possible to preserve the sharp shape of the second trench 125, stress may be effectively applied to the channel 112. Exemplary embodiments described with reference to FIG. 1I may have the above technical features. In at least one exemplary embodiment, a silicide layer 160 may be additionally formed on the junction region 150 to reduce a contact resistance between the junction region 150 and a plug (not shown) coupled thereto. The silicide layer 160 may be formed between adjacent gate electrode structures 119. Each silicide layer 160 may further include opposing ends, each which are coupled to a spacer 117 of the respective gate electrode structure 119.

Referring to FIG. 1I, a junction region 152 may be formed by filling the second trench 125 with a silicon-carbide (SiC) layer. The formation of the junction region 152 may include epitaxially growing a silicon-carbide layer from the second trench 125 and then doping the silicon-carbide layer with phosphorus (P) or arsenic (As) atoms. Alternatively, the junction region 152 may be formed by epitaxially growing a phosphorus (P) or arsenic (As)-doped silicon-carbide layer. The junction region 152 of silicon-carbide (SiC) may have a smaller lattice constant than the channel 112 of silicon (Si), the junction region 152 may exert a tensile stress (depicted by a dotted arrow line) on the channel 112. As a result, NMOS transistors of the semiconductor device 20 may have increased mobility of majority carriers (i.e., electrons). In some exemplary embodiments, the silicide layer 160 may be additionally formed on the junction region 152 to reduce a contact resistance between the junction region 152 and a plug coupled thereto.

[Non-Cycling Process]

Figure 2A:
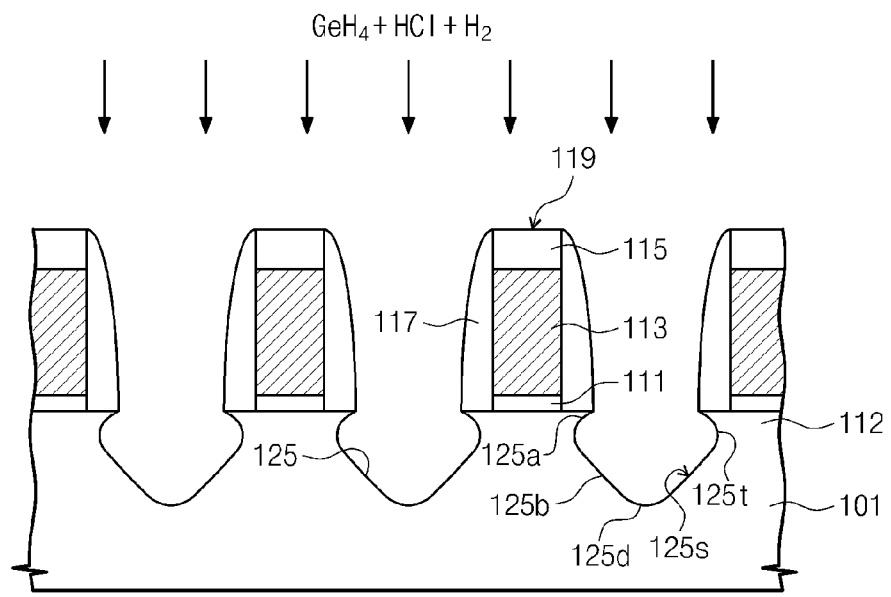
FIGS. 2A and 2B are sectional views illustrating a non-cycling process, which may be performed in methods of fabricating a semiconductor device according to exemplary embodiments of the present general inventive concept.
Figure 2B:
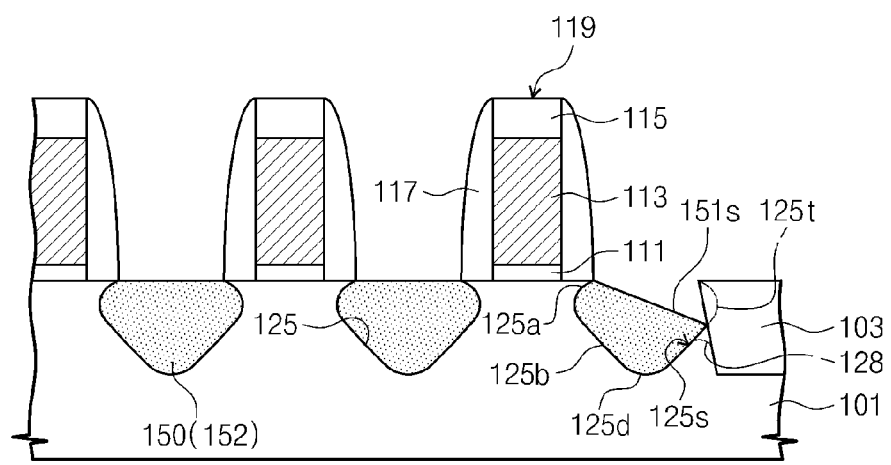
Figure 2C:
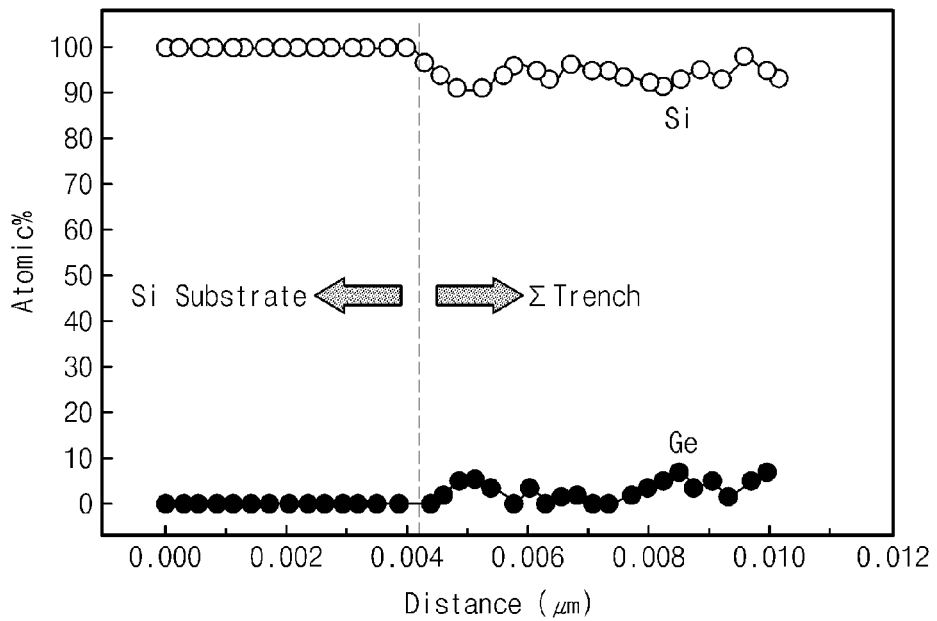
FIGS. 2C through 2E are graphs of germanium content measured from a semiconductor device fabricated by the method including the non-cycling process.
Figure 2D:
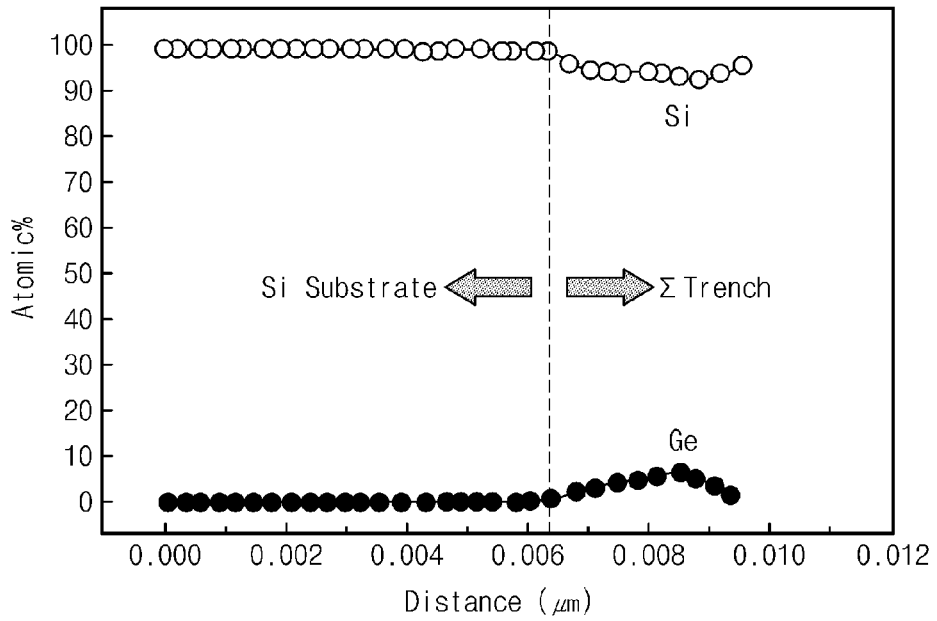
Figure 2E:
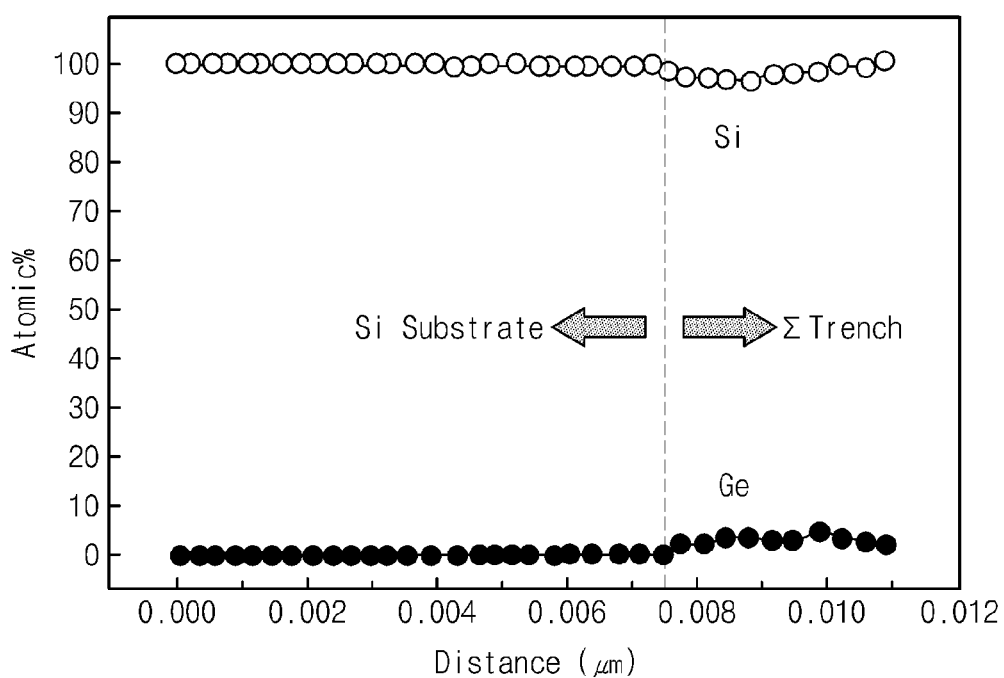

FIGS. 2A and 2B are sectional views illustrating a non-cycling process, which may be performed in methods of fabricating a semiconductor device according to exemplary embodiments of the present general inventive concept. FIGS. 2C through 2E are graphs of germanium content measured from a semiconductor device fabricated by the method including the non-cycling process.

Referring to FIG. 2A, as described with reference to FIG. 1F, in the case that only the first operation is performed, the tips 125t and 125d of the second trench 125 may result in a rounded shape without any sharp corner, due to migration of silicon atoms in the semiconductor substrate 101. The rounded tip 125t at both sides of the second trench 125 may fail in effectively applying stress to the channel 112, compared with the case having the sharp shape. Moreover, in the case that the tip 125d at a bottom of the second trench 125 is rounded, the second trench 125 may expose planes having more defects than the (111) crystal plane. Consequently, an epitaxial growth rate of SiGe or SiC may become slow. These difficulties may occur even in the case that the bottom of the second trench 125 is the (100) crystal plane like the third plane 125c shown in FIG. 1C.

Referring to FIG. 2B, in addition to the rounding of the second trench 125, the tip 125t of the second trench 125 may be excessively deformed around a device isolation layer 103. In this case, the epitaxial layer (i.e., the junction region 150 or 152 of SiGe or SiC, respectively) may be improperly grown from the second trench 125. For example, a top surface 151s of the epitaxial layer may be lowered, thereby resulting in a slanted top surface 151s extending between isolation layer and an adjacent gate electrode structure 119. The lowering of the top surface 151s of the epitaxial layer may lead to technical difficulties associated to the connection between the plug and/or the silicide layer 160, and the epitaxial layer (i.e., the junction region 150 or 152 of SiGe or SiC). The second lattice plane 125b adjacent to the device isolation layer 103 may be deformed or rounded as depicted by the reference numeral 128. In this case, due to the presence of the rounded portion 128, the epitaxial layer of SiGe or SiC may be grown with a decreased growth rate, and this may lead to an additional lowering of the top surface 151s of the junction region 150 or 152.

If the cleaning process is performed using only the first operation, unintentional germanium atoms may remain on the surface 125s of the second trench 125, in addition to the rounding of the second trench 125 and/or the deformation of the tip 125t. For instance, as shown in FIGS. 2C through 2E, germanium atoms may be empirically detected from several regions of the second trench 125. FIGS. 2C through 2E show atomic percentages of germanium, which were measured from regions corresponding to the first plane 125a, the second plane 125b, and the tip 125d, respectively, using an energy dispersive X-ray (EDX) spectroscopy.

Even when the cleaning process includes only the first operation performed at a temperature of 700° C. or less, according to other exemplary embodiments, it may be possible to effectively remove the extra germanium layer 190, to preserve the sharp shapes of the tips 125t and 125d, as illustrated in FIGS. 1C, 1D, 1H and 1I, and to suppress and/or prevent the deformation of the tip 125t and the rounding of the second lattice plane 125b, as will be described in the following.

[Cycling Process]

Figure 3A:
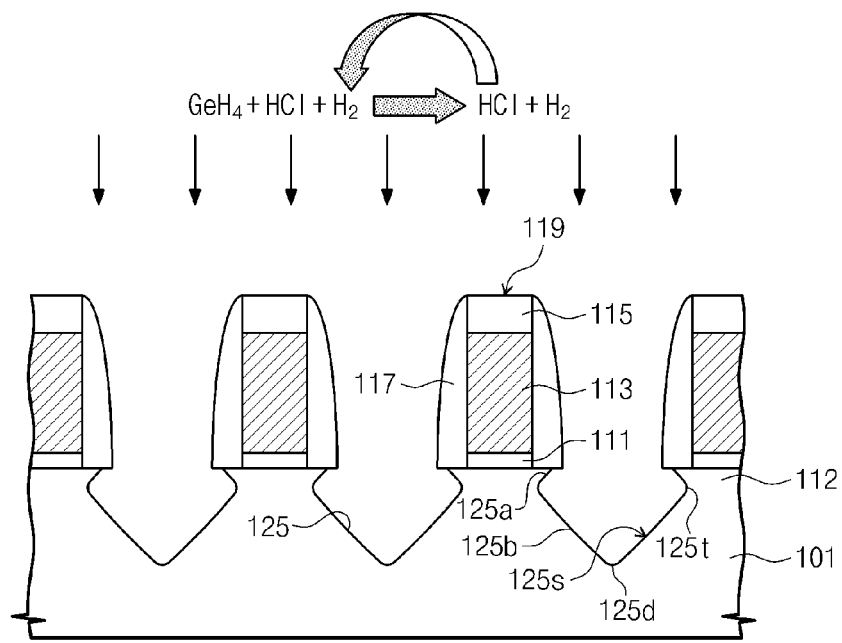
FIGS. 3A and 3B are sectional views illustrating a cycling process, which may be performed in methods of fabricating a semiconductor device according to exemplary embodiments of the present general inventive concept.
Figure 3B:
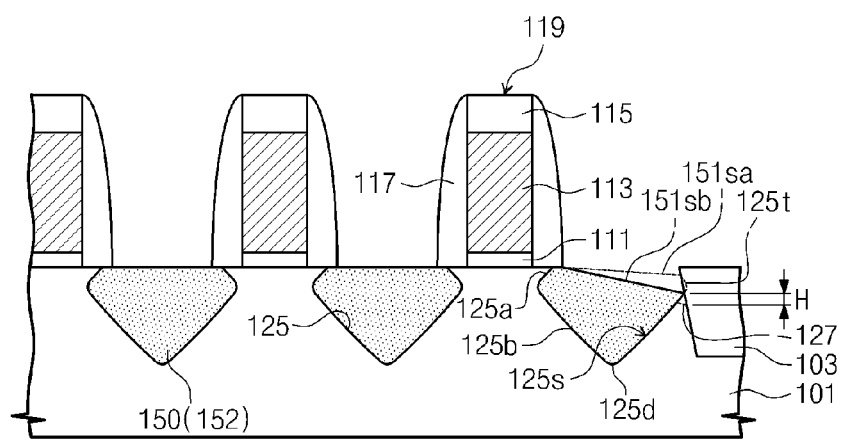
Figure 3C:
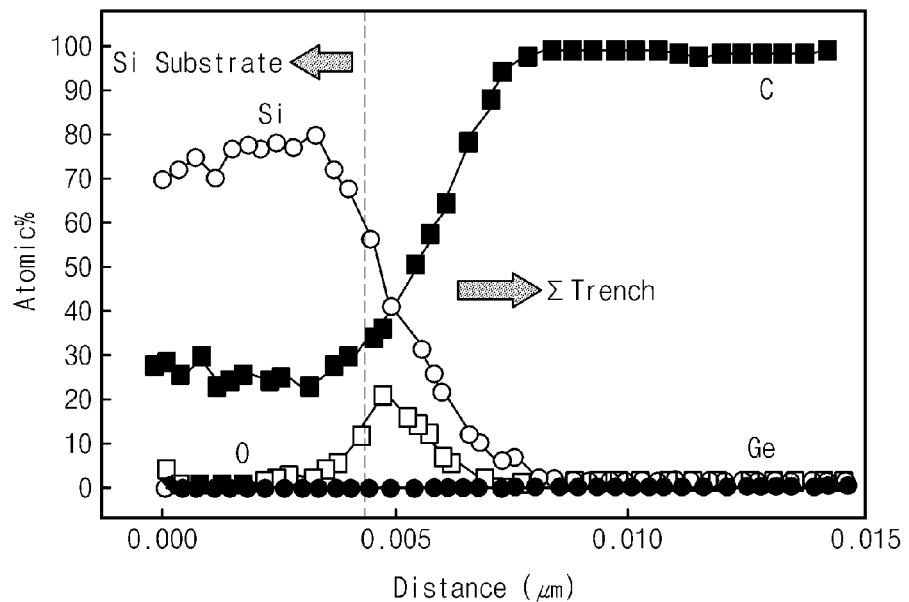
FIGS. 3C through 3E are graphs of germanium content measured from a semiconductor device fabricated by the method including the cycling process.
Figure 3D:
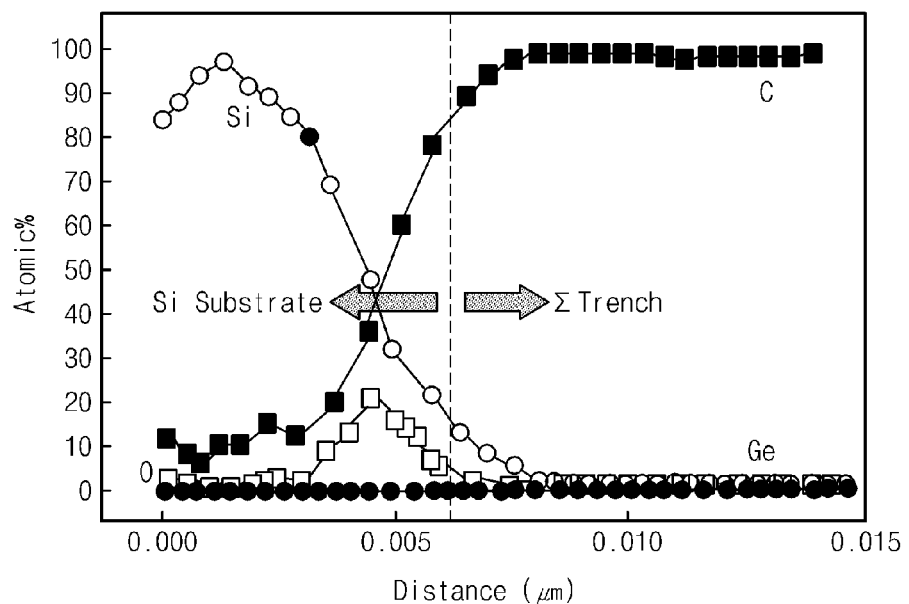
Figure 3E:
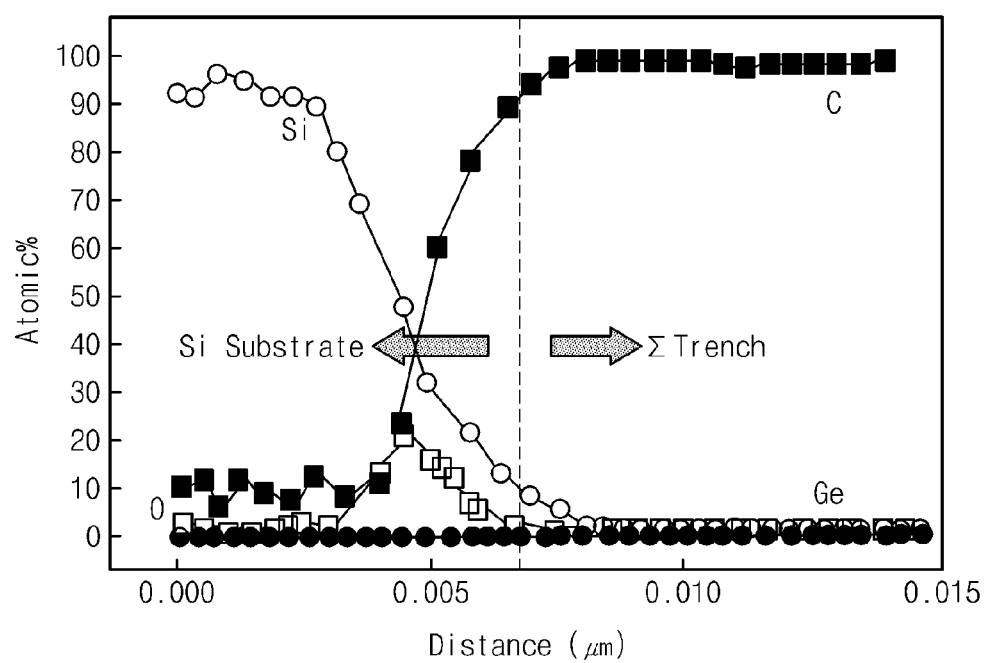

FIGS. 3A and 3B are sectional views illustrating a cycling process, which may be performed in methods of fabricating a semiconductor device according to exemplary embodiments of the present general inventive concept. FIGS. 3C through 3E are graphs of germanium content measured from a semiconductor device fabricated by the method including the cycling process.

Referring to FIG. 3A, the cycling process may be performed on the semiconductor substrate 101 provided with the second trench 125 at least one time. In this case, as illustrated in FIGS. 3C through 3E, germanium atoms may be effectively removed from the surface 125s of the second trench 125 by performing the cycling process at least one time, where FIGS. 3C through 3E show atomic percentages of germanium, which were measured from regions corresponding to the first plane 125a, the second plane 125b, and the tip 125d, respectively, using an energy dispersive X-ray (EDX) spectroscopy. Meanwhile, it should be noted that the presence of carbon and oxygen, depicted in the graphs of FIGS. 3C through 3E, are originated from materials associated with preparation of EDX samples and are irrelevant to exemplary embodiments of the present general inventive concept.

Figure 4A:
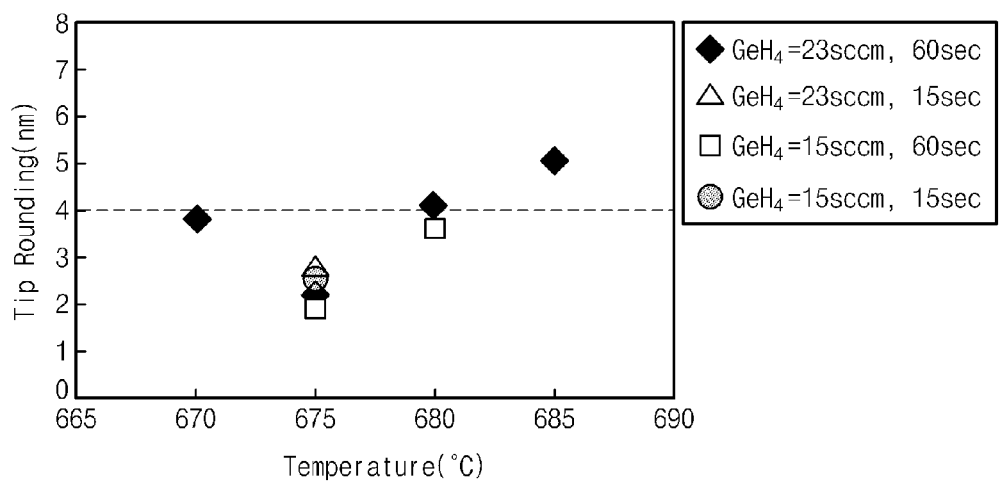
FIG. 4A is a graph illustrating a relationship between a process condition and a tip rounding.

According to exemplary embodiments of the present general inventive concept, the tips 125t and 125d of the second trench 125 may be maintained in the sharp shape. For instance, as shown in FIG. 4A, the curvature or rounding of the tip 125t may be very small, i.e., about 4 nm. FIG. 4A is a graph illustrating a relationship between a process condition and a tip rounding. Referring to FIG. 4A in conjunction with FIG. 3A, when the first operation supplying the first reaction gas is performed at 650° C. to 700° C. or when the first and second operations supplying the first and second reaction gases, respectively, are sequentially performed, the curvature of the tip 125t was about 5 nm or less. From FIG. 4A, it can be said that the process temperature of 680° C. or less makes it possible for the tip 125t to have a curvature of about 4 nm or less or a sharp shape. It may be similar in effect to the tip 125d. Since the tips 125t and 125d can be maintained in the sharp shape, stress can be effectively applied to the channel 112 and the epitaxial layer of SiGe or SiC can be properly grown.

According to exemplary embodiments of the present general inventive concept, as shown in FIG. 3B, the tip 125t may be formed without any serious deformation or collapse thereof, even near the device isolation layer 103. In other words, it may be possible to suppress a surface 151sa of the junction region 150 or 152 from being lowered and/or slanted. Even in the case that the tip 125t is deformed or collapsed, such deformation may be remarkably reduced compared with the exemplary embodiments described with reference to FIG. 2B, and thus, it may be possible to suppress a surface 151sa of the junction region 150 or 152 from being excessively lowered and/or slanted.

An STI collapse, in which the second plane 125b adjacent to the device isolation layer 103 is collapsed and rounded as depicted by the reference numeral 127, may occur regardless of, or in conjunction with, the deformation of the tip 125t. The term "STI collapse" may refer to a collapse or deformation of the tip 125t of the second trench 125 adjacent to the device isolation layer 103 and/or a collapse or deformation of the sigma profile. Even in the case that the second plane 125b is rounded, the collapse height H may be about 8 nm or less, as shown in FIG. 4B.

Figure 4B:
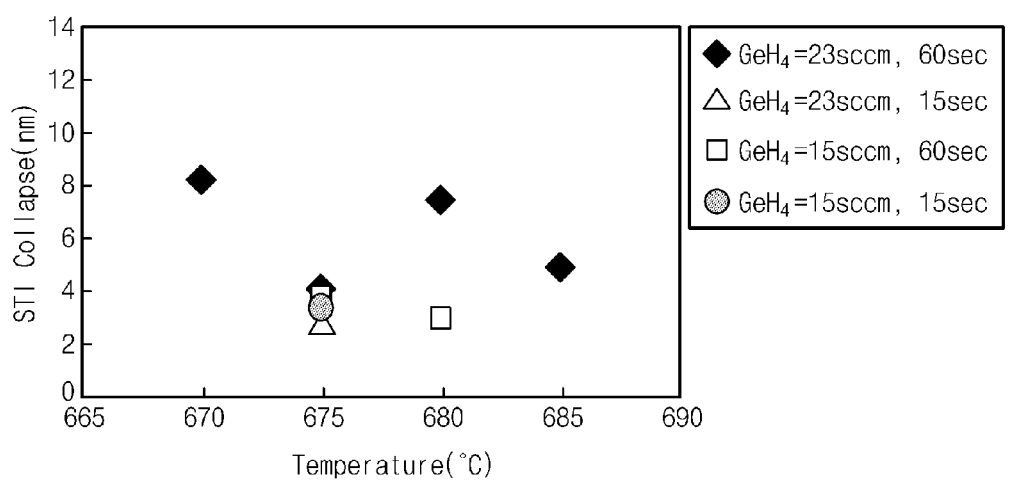
FIG. 4B is a graph illustrating a relationship between a process condition and deformation of a device isolation layer.

FIG. 4B is a graph illustrating a relationship between a process condition and deformation of a device isolation layer. As shown in FIG. 4B, the collapse height H may be controlled down to less than about 5 nm by adjusting the process condition, such as the flow rate of germane (GeH4), the process time, and/or the process temperature. As mentioned above, the STI collapse may not lead to a remarkable change of the growth rate of the epitaxial layer of SiGe or SiC.

Figure 5A:
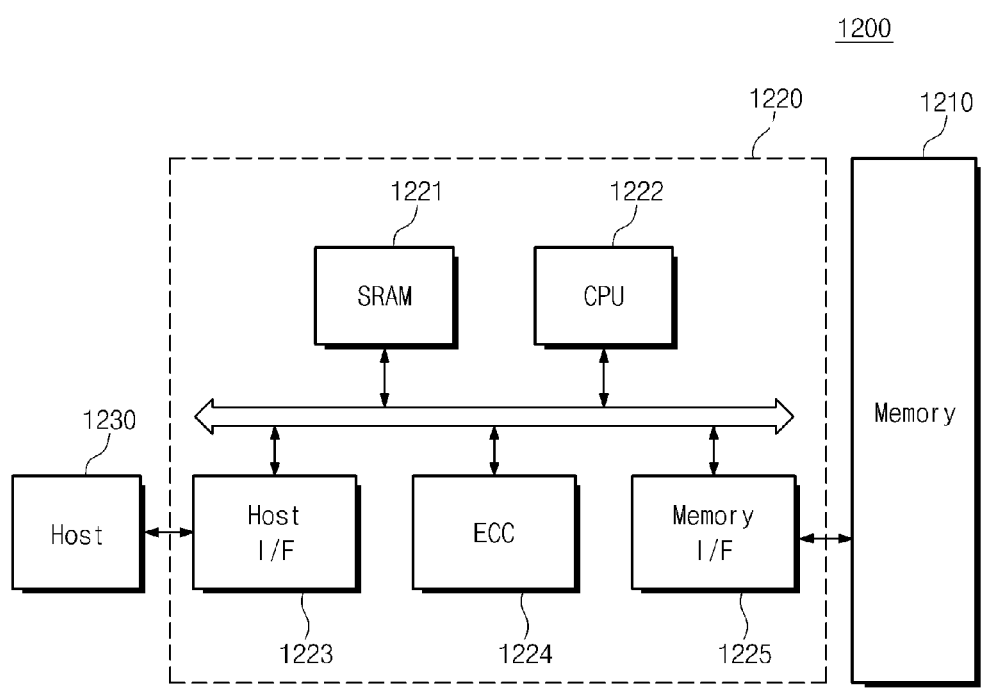
FIG. 5A is a block diagram illustrating a memory card including a semiconductor device according to exemplary embodiments of the present general inventive concept.
Figure 5B:
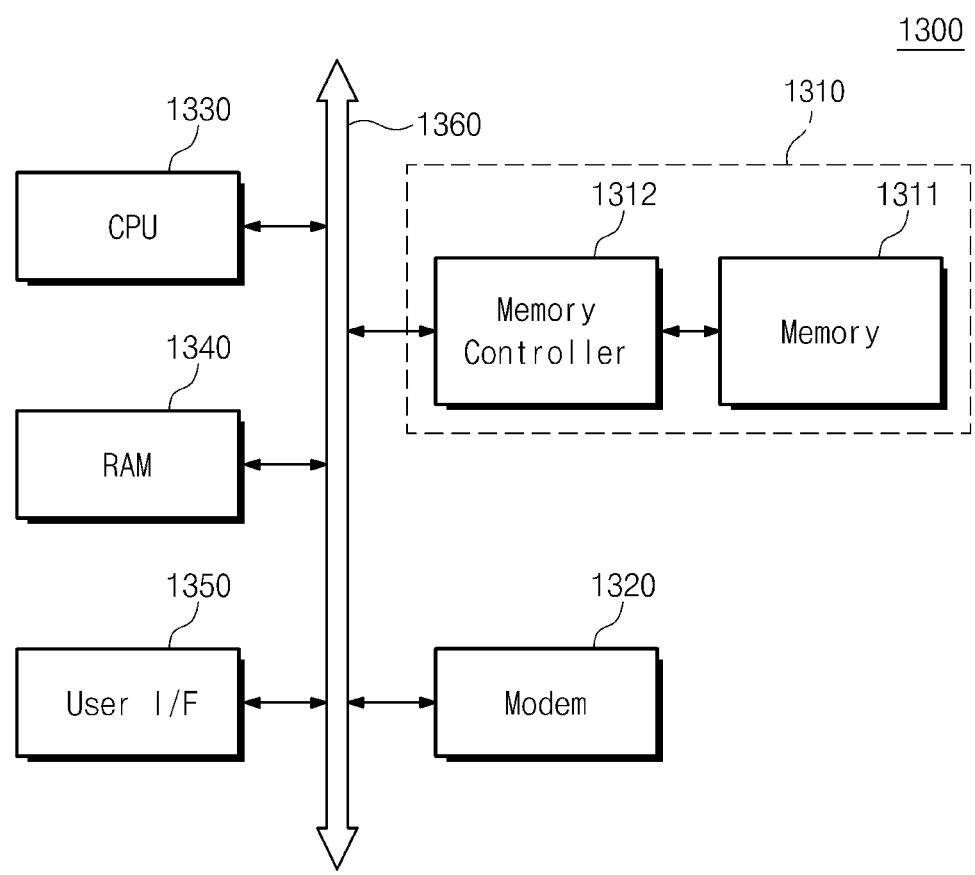
FIG. 5B is a block diagram illustrating an information processing system including a semiconductor device according to exemplary embodiments of the present general inventive concept.

FIG. 5A is a block diagram illustrating a memory card including a semiconductor device according to exemplary embodiments of the present general inventive concept. FIG. 5B is a block diagram illustrating an information processing system including a semiconductor device according to exemplary embodiments of the present general inventive concept.

Referring to FIG. 5A, a memory card 1200 may be realized using a memory device 1210 including at least one of the semiconductor devices 10 and 20 according to exemplary embodiments of the present general inventive concept. In some exemplary embodiments, the memory card 1200 may include a memory controller 1220 controlling general data exchanges between a host and the memory device 1210. A static random access memory (SRAM) 1221 may be used as an operating memory of a processing unit 1222. A host interface 1223 may include a data exchange protocol of a host connected to a memory card 1200. An error correction block 1224 may detect and correct errors included in data read from a multi-bit memory device 1210. A memory interface 1225 may interface with the memory device 1210. A processing unit 1222 may perform general control operations to exchange data of the memory controller 1220.

Referring to FIG. 5B, an information processing system 1300 may be realized using a memory system 1310 including at least one of the semiconductor devices 10 and 20 according to exemplary embodiments of the present general inventive concept. For instance, the information processing system 1300 may be a mobile device and/or a desktop computer. In some exemplary embodiments, the information processing system 1300 may further include a modem 1320, a central processing unit (CPU) 1330, a RAM 1340, and a user interface 1350, which are electrically connected to a system bus 1360, in addition to the memory system 1310. The memory system 1310 may include a memory device 1311 and a memory controller 1312. In some exemplary embodiments, the memory system 1310 may be configured substantially identical to the memory system described with respect to FIG. 5A. Data processed by the CPU 1330 and/or input from the outside may be stored in the memory system 1310. In some exemplary embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the present general inventive concept.

According to exemplary embodiments of the present general inventive concept, a native oxide layer can be removed from a trench surface using a reaction gas containing germanium, and a germanium layer, which may be unintentionally deposited on the trench surface, can be removed by a cycling process using a reaction gas capable of etching germanium. In other words, it is possible to effectively remove elements and/or factors providing a negative effect on a growth rate of an epitaxial layer. In addition, it is possible to sharply maintain a sigma profile of the trench, and therefore, stress can be effectively applied to a channel region of a transistor. Accordingly, a semiconductor device that provides increased carrier mobility may be achieved.

Furthermore, according to exemplary embodiments of the present general inventive concept, it is possible to suppress and/or prevent the trench from being excessively collapsed and/or deformed. As a result, it is possible to realize a semiconductor device with improved electrical properties.

Although a few exemplary embodiments of the present general inventive concept have been shown and described, it will be appreciated by those skilled in the art that changes may be made in these exemplary embodiments without departing from the principles and spirit of the general inventive concept, the scope of which is defined in the appended claims and their equivalents.

What is claimed is:

1. A method of fabricating a semiconductor device, comprising:
   forming a trench in a semiconductor substrate;
   performing a cycling process to remove contaminants from the trench, the cycling process comprising sequentially supplying a first reaction gas and a second reaction gas onto the semiconductor substrate, the first reaction gas containing germane (GeH4), hydrogen chloride (HCl) and hydrogen (H2), and the second reaction gas containing hydrogen chloride (HCl) and hydrogen (H2); and
   forming an epitaxial layer in the trench,
   wherein the supplying of the first reaction gas comprises supplying the hydrogen chloride (HCl) with a flow rate greater than 150 times a flow rate of the germane (GeH4).

2. The method of claim 1, wherein the performing of the cycling process comprises removing a native oxide layer from the trench using the germane (GeH4) of the first reaction gas and removing a germanium layer from the trench using the hydrogen chloride (HCl) of the first reaction gas, and wherein the epitaxial layer is formed after preforming the cycling process.

3. The method of claim 2, wherein the performing of the cycling process further comprises removing a remaining portion of the germanium layer, which is not removed by the first reaction gas, using the hydrogen chloride (HCl) of the second reaction gas.

4. The method of claim 1, wherein the supplying of the first reaction gas comprises supplying the first reaction gas under a pressure of about 1 Torr to about 100 Torr at a temperature of about 500° C. to about 800° C.

5. The method of claim 4, wherein the supplying of the first reaction gas comprises supplying the germane (GeH4) with a partial pressure of 0.3 mTorr or less and with a flow rate of about 0.75 sccm or more.

6. The method of claim 5, wherein the supplying of the first reaction gas comprises supplying the hydrogen chloride (HCl) with a partial pressure greater than 150 times a partial pressure of the germane (GeH4) and with a flow rate of about 150 sccm or more.

7. The method of claim 6, wherein at least one of the supplying of the first reaction gas and the supplying of the second reaction gas comprises the hydrogen (H2) with a flow rate of about 30 slm to about 50 slm.

8. The method of claim 4, wherein the supplying of the second reaction gas comprises supplying the second reaction gas under a pressure of about 1 Torr to about 100 Torr at a temperature of about 500° C. to about 800° C. or about 700° C. to about 800° C. during a process time, of which a temporal length ratio relative to the first reaction gas is about 0.1 to about 10.

9. The method of claim 1, wherein the performing of the cycling process comprises sequentially supplying the first reaction gas and the second reaction gas, under a pressure of about 1 Torr to about 100 Torr at a temperature of about 500° C. to about 800° C.

10. The method of claim 1, wherein the forming of the epitaxial layer comprises growing a layer with a lattice constant different from the semiconductor substrate from a surface of the trench.

11. A method of fabricating a semiconductor device, comprising:
    forming a plurality of gate electrode structures on a semiconductor substrate having at least one crystal plane;
    etching the semiconductor substrate between the gate electrode structures to form a trench including at least one tip protruding toward a channel region which is a portion of the semiconductor substrate below the gate electrode structure, and a surface of the trench comprising crystal planes having relatively high density compared to other crystal planes of the semiconductor substrate;
    supplying a first reaction gas containing germane (GeH4), hydrogen chloride (HCl) and hydrogen (H2) onto the semiconductor substrate to remove a native oxide layer and a germanium layer from the inner surfaces of the trench;
    supplying a second reaction gas containing hydrogen chloride (HCl) and hydrogen (H2) onto the semiconductor substrate to remove a remaining portion of the germanium layer, which is not removed by the first reaction gas; and
    forming a junction region in the trench,
    wherein the supplying of the first reaction gas comprises supplying the hydrogen chloride (HCl) with a flow rate greater than 150 times a flow rate of the germane (GeH4).

12. The method of claim 11, wherein the semiconductor substrate is a silicon substrate having a top surface of (100) crystal plane, and
    the trench comprises inner surfaces of (111) crystal plane, wherein the inner surfaces of (111) crystal plane contact with each other to make the tip.

13. The method of claim 12, wherein the forming of the trench comprises:
    isotropically etching the semiconductor substrate using a dry etching process to form a preliminary trench having a substantially elliptical profile in the semiconductor substrate; and
    etching the semiconductor substrate using a wet etching process to enlarge the preliminary trench such that the trench is formed to have corners defined by the inner surfaces of the (111) crystal plane.

14. The method of claim 12, wherein the forming of the junction region comprises at least one of growing a silicon-germanium (SiGe) layer with a lattice constant greater than the silicon substrate, and epitaxially growing a silicon-carbide (SiC) layer with a lattice constant smaller than the silicon substrate.

15. A method of increasing stress on a channel of a gate structure including in a semiconductor device, the method comprising:
    forming a first trench adjacent to the channel;
    etching the first trench to form a second trench having corners being substantially pointed, the corners including a tip portion extending laterally with respect to the channel and beneath the gate structure;
    performing a cycling process to remove contaminants from the second trench, the cycling process comprising sequentially supplying a first reaction gas and a second reaction gas onto the semiconductor substrate, the first reaction gas containing germane (GeH4), hydrogen chloride (HCl) and hydrogen (H2), and the second reaction gas containing hydrogen chloride (HCl) and hydrogen (H2); and
    forming a junction region having a lattice constant different from a material of the channel to exert a stress on the channel,
    wherein the supplying of the first reaction gas comprises supplying the hydrogen chloride (HCl) with a flow rate greater than 150 times a flow rate of the germane (GeH4).

16. The method of claim 15, wherein the forming a junction region includes epitaxially growing a silicon-germanium layer from the second trench, and doping the silicon-germanium layer with boron atoms.

17. The method of claim 16, wherein the epitaxially growing includes epitaxially growing the silicon-germanium layer having a greater lattice constant than the material of the channel such that a compressive stress is exerted on the channel to increase mobility of majority carriers in the channel.

18. The method of claim 15, wherein the forming a junction region includes epitaxially growing a silicon-carbide layer from the second trench and then doping the silicon-carbide layer with at least one of phosphorus atoms and arsenic atoms.

19. The method of claim 18, wherein the epitaxially growing includes epitaxially growing the silicon-carbide layer having a smaller lattice constant than the material of the channel such that a tensile stress is exerted on the channel to increase mobility of majority carriers in the channel.

20. A method of fabricating a semiconductor device, comprising:
   forming a trench in a semiconductor substrate;
   performing a cycling process to remove contaminants from the trench, the cycling process comprising supplying a reaction gas onto the semiconductor substrate at a temperature of 700° C. or less, the reaction gas containing germane (GeH4), hydrogen chloride (HCl) and hydrogen (H2) having a ratio in flow rate of HCl to GeH4 of 150 or more; and
   forming an epitaxial layer in the trench.

* * * * *

UNITED STATES PATENT AND TRADEMARK OFFICE
CERTIFICATE OF CORRECTION

PATENT NO. : 8,900,942 B2
APPLICATION NO. : 13/422077
DATED : December 2, 2014
INVENTOR(S) : Kim et al.

It is certified that error appears in the above-identified patent and that said Letters Patent is hereby corrected as shown below:

In the Specification:
Column 7, Line 20: Please correct "FIG.10," to read -- FIG. 1C, --

Signed and Sealed this
Fourteenth Day of June, 2016

Michelle K. Lee
*Director of the United States Patent and Trademark Office*